United States Patent
Yamamoto et al.

(10) Patent No.: US 10,256,195 B2
(45) Date of Patent: Apr. 9, 2019

(54) MODULE AND METHOD FOR MANUFACTURING SAME

(71) Applicant: Murata Manufacturing Co., Ltd, Kyoto (JP)

(72) Inventors: Issei Yamamoto, Kyoto (JP); Atsushi Shimizu, Kyoto (JP); Yoichi Takagi, Kyoto (JP); Hideo Nakagoshi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/846,541

(22) Filed: Dec. 19, 2017

(65) Prior Publication Data

US 2018/0108618 A1    Apr. 19, 2018

Related U.S. Application Data

(63) Continuation of application No. PCT/JP2016/067875, filed on Jun. 16, 2016.

(30) Foreign Application Priority Data

Jun. 19, 2015   (JP) .................................. 2015-123472

(51) Int. Cl.
   *H01L 23/552*   (2006.01)
   *H01L 23/00*    (2006.01)
   (Continued)

(52) U.S. Cl.
   CPC ........ *H01L 23/552* (2013.01); *C23C 14/0036* (2013.01); *C23C 14/0641* (2013.01);
   (Continued)

(58) Field of Classification Search
   CPC ........... H01L 23/552; H01L 2924/3025; H01L 2225/06537; H01L 23/3142
   See application file for complete search history.

(56) References Cited

U.S. PATENT DOCUMENTS

2005/0045358 A1* 3/2005 Arnold ................ H05K 9/0024
                                                              174/51
2006/0130522 A1    6/2006 Fukumoto et al.
(Continued)

FOREIGN PATENT DOCUMENTS

JP        60189226 A      9/1985
JP       200334828 A      2/2003
(Continued)

OTHER PUBLICATIONS

International Search Report for Application Serial No. PCT/JP2016/067875 dated Jul. 16, 2016.
(Continued)

*Primary Examiner* — Mohammed R Alam
(74) *Attorney, Agent, or Firm* — Pearne & Gordon LLP

(57) ABSTRACT

A module includes a wiring board, a plurality of components mounted on an upper surface of the wiring board, a sealing resin layer which seals the components provided on the upper surface of the wiring board, and a shield layer provided so as to cover a surface of the sealing resin layer. The shield layer includes an adhesion layer which is stacked on the surface of the sealing resin layer and includes a first adhesion film composed of a metal selected from the group consisting of Ti, Cr, Ni, TiCr, TiAl, NiAl, CrAl, and CrNiAl, a conductive layer which is stacked on the adhesion layer, and a protective layer which is stacked on the conductive layer and includes a protective film composed of a nitride, oxide, or oxynitride of a metal selected from the group consisting of Ti, Cr, Ni, TiCr, TiAl, NiAl, CrAl, and CrNiAl.

13 Claims, 3 Drawing Sheets

(51) Int. Cl.
    *H01L 23/28*     (2006.01)
    *H05K 9/00*     (2006.01)
    *C23C 14/00*     (2006.01)
    *C23C 14/06*     (2006.01)
    *C23C 14/14*     (2006.01)
    *C23C 14/24*     (2006.01)
    *H01L 21/285*     (2006.01)
    *H01L 21/3205*     (2006.01)
    *H01L 23/498*     (2006.01)
    *H01L 23/31*     (2006.01)
    *H01L 25/16*     (2006.01)

(52) U.S. Cl.
    CPC .............. *C23C 14/14* (2013.01); *C23C 14/24* (2013.01); *H01L 21/2855* (2013.01); *H01L 21/32051* (2013.01); *H01L 23/00* (2013.01); *H01L 23/28* (2013.01); *H01L 23/3135* (2013.01); *H01L 23/3142* (2013.01); *H01L 23/49838* (2013.01); *H05K 9/00* (2013.01); *H01L 23/3121* (2013.01); *H01L 25/165* (2013.01); *H01L 2224/16225* (2013.01); *H01L 2924/181* (2013.01); *H01L 2924/19105* (2013.01)

(56) References Cited

U.S. PATENT DOCUMENTS

| | | | |
|---|---|---|---|
| 2010/0172116 A1* | 7/2010 | Yorita | .................. H01L 21/565 |
| | | | 361/816 |
| 2011/0117342 A1 | 5/2011 | Sugita et al. | |
| 2013/0134036 A1 | 5/2013 | Liu et al. | |
| 2013/0214396 A1* | 8/2013 | Kim | ...................... H01L 23/552 |
| | | | 257/659 |
| 2016/0165768 A1 | 6/2016 | Tanaka | |

FOREIGN PATENT DOCUMENTS

| | | |
|---|---|---|
| JP | 2006176344 A | 7/2006 |
| JP | 2007243122 A | 9/2007 |
| JP | 2013150014 A | 8/2013 |
| JP | 2013112897 A | 10/2013 |
| JP | 201515299 A | 1/2015 |
| WO | 2010007661 A1 | 1/2010 |

OTHER PUBLICATIONS

Written Opinion for Application Serial No. PCT/JP2016/067875 dated Jul. 16, 2016.

\* cited by examiner

| METAL TYPE | VICKERS HARDNESS OF METAL (HV) | VICKERS HARDNESS OF NITRIDE (HV) |
|---|---:|---:|
| Ti | 230 | 2400 |
| Cr | 1060 | 2200 |
| TiAl | 400 | 2500 |

MODULE AND METHOD FOR MANUFACTURING SAME

This is a continuation of International Application No. PCT/JP2016/067875 filed on Jun. 16, 2016 which claims priority from Japanese Patent Application No. 2015-123472 filed on Jun. 19, 2015. The contents of these applications are incorporated herein by reference in their entireties.

BACKGROUND OF THE DISCLOSURE

Field of the Disclosure

The present disclosure relates to a module including a sealing resin layer which covers a component mounted on a wiring board and a shield layer stacked on the sealing resin layer, and a method for manufacturing the same.

Description of the Related Art

Modules to be installed in portable terminal equipment or the like may be provided in some cases with a shield layer for intercepting electromagnetic waves. In such modules, components mounted on a wiring board may be covered with a mold resin, and a shield layer may be provided so as to cover a surface of the mold resin. The shield layer generally includes a conductive film formed of Cu, Al, Ag, or the like for the purpose of electromagnetic shielding. All of these metal films have low adhesion strength with the mold resin and insufficient corrosion resistance, which is a problem.

Accordingly, there has been proposed a shield layer which has high adhesion with a resin and excellent corrosion resistance. For example, as shown in FIG. 5, a module 100 described in Patent Document 1 includes a resin substrate 101 and a shield layer 102 stacked on an upper surface of the resin substrate 101, and the shield layer 102 has a three-layer structure including an adhesion film 102a deposited on the resin substrate 101, a conductive film 102b deposited on the adhesion film 102a, and a protective film 102c deposited on the conductive film 102b. The conductive film 102b is formed of any one of Cu, Ag, and Al. Furthermore, the adhesion film 102a is formed of SUS which has higher adhesion strength with the resin substrate 101 than the conductive film 102b. Furthermore, the protective film 102c deposited on the conductive film 102b is formed of SUS which has higher corrosion resistance than the conductive film 102b. By forming the shield layer 102 so as to have a three-layer structure in such a manner, improvements in adhesion strength, corrosion resistance, and the like are achieved.

Patent Document 1: Japanese Unexamined Patent Application Publication No. 2007-243122 (refer to paragraphs 0019 to 0026, FIG. 1, etc.)

BRIEF SUMMARY OF THE DISCLOSURE

The SUS constituting the protective film 102c of the existing shield layer 102 has excellent corrosion resistance because Cr binds to oxygen to form a passive film on the surface thereof. However, the SUS has a low hardness (Vickers hardness . . . 200 HV or less for both SUS304 and SUS310), and scratches are likely to occur on the surface of the shield film when the product comes into contact with a jig or the like in processes after shield formation (bump printing, measurement, and the like), which is a problem. Accordingly, in order to improve the scratch resistance of the shield layer, an improvement in the hardness of the protective film is required.

The present disclosure has been made in view of the problems described above, and it is an object of the present disclosure to provide a module including a shield layer having excellent adhesion strength and scratch resistance.

In order to achieve the object, a module according to the present disclosure includes a wiring board, a component mounted on a principal surface of the wiring board, a sealing resin layer which is provided on the principal surface of the wiring board and covers the component, and a shield layer provided so as to cover a surface of the sealing resin layer, wherein the shield layer includes an adhesion layer which is stacked on the surface of the sealing resin layer and includes a first adhesion film composed of a metal selected from the group consisting of Ti, Cr, Ni, TiCr, TiAl, NiAl, CrAl, and CrNiAl, a conductive layer which is stacked on the adhesion layer, and a protective layer which is stacked on the conductive layer and includes a protective film composed of a nitride, oxide, or oxynitride of a metal selected from the group consisting of Ti, Cr, Ni, TiCr, TiAl, NiAl, CrAl, and CrNiAl.

According to this structure, the first adhesion film is formed of a metal selected from the group consisting of Ti, Cr, Ni, TiCr, TiAl, NiAl, CrAl, and CrNiAl. All of these metal films have higher adhesion strength with the sealing resin layer than Cu, Al, or Ag which is a metal generally used for forming a conductive layer. Furthermore, the protective film formed of a nitride, oxide, or oxynitride of any one of these metals has a higher hardness than a protective film composed of an alloy, such as SUS TiCr, TiAl, NiAl, CrAl, or CrNiAl, or a single metal. Therefore, a module including a shield layer having excellent adhesion strength and scratch resistance can be provided.

Furthermore, the protective film may be composed of a nitride, oxide, or oxynitride of the same metal as that of the first adhesion film. In this case, for example, when the shield layer is formed by using a sputtering system or the like, the same target can be used for the first adhesion film and the protective film, and therefore, the cost for forming the shield layer can be reduced.

Furthermore, the protective layer may further include a second adhesion film composed of a metal selected from the group consisting of Ti, Cr, Ni, TiCr, TiAl, NiAl, CrAl, and CrNiAl, the second adhesion film being disposed between the conductive layer and the protective film. In this case, the second adhesion film can achieve an improvement in the adhesion strength between the conductive layer and the protective film.

Furthermore, the composition ratio of nitrogen in the nitride or the composition ratio of oxygen in the oxide constituting the protective film in the inner layer side of the protective film close to the conductive layer may be lower than that in the outer layer side of the protective film far from the conductive layer. In this case, since the amount of a metal component selected from the group consisting of Ti, Cr, Ni, TiCr, TiAl, NiAl, CrAl, and CrNiAl in the inner layer side of the protective film is larger than that in the outer layer side of the protective film, the adhesion strength between the conductive layer and the protective film is improved. On the other hand, since the amount of the oxygen component or nitrogen component in the outer layer side of the protective film is larger than that in the inner layer side of the protective film, scratch resistance is improved. That is, improvements in the scratch resistance of the protective film and the adhesion strength with the conductive layer can be achieved.

Preferably, among the adhesion layer, the conductive layer, and the protective layer, the conductive layer has the largest thickness, and the adhesion layer has the smallest thickness. Generally, when a conductive layer is connected to a ground electrode disposed in a wiring board, shielding characteristics will be improved. The shielding characteristics will be improved as the thickness of the conductive layer increases and will be improved as the connection resistance between the conductive layer and the ground electrode decreases. Accordingly, by forming the adhesion film having a higher resistivity than the conductive layer so as to have the smallest thickness and forming the conductive layer so as to have the largest thickness, an improvement in shielding characteristics of the shield layer can be achieved.

Preferably, the first adhesion film is composed of a TiAl alloy, the conductive layer is composed of Cu, and the protective film is composed of a nitride of a TiAl alloy. Accordingly, a module including a shield layer having excellent adhesion strength and scratch resistance can be provided.

Preferably, the first adhesion film is composed of a TiAl alloy, the conductive layer is composed of Cu, and the protective film is composed of an oxynitride of a TiAl alloy. Accordingly, a module including a shield layer having excellent adhesion strength and scratch resistance can be provided.

Preferably, the second adhesion film is composed of a TiAl alloy. Accordingly, the adhesion strength between the conductive layer and the protective film can be improved.

Preferably, the protective film is black in color. Accordingly, the temperature of the module product can be maintained low.

Furthermore, a method for manufacturing a module according to the present disclosure includes a preparation step of preparing a mold structure which includes a wiring board, a component mounted on a principal surface of the wiring board, and a sealing resin layer provided on the principal surface of the wiring board so as to cover the principal surface of the wiring board and the component; and a shield formation step of forming a shield layer on a surface of the sealing resin layer by using a sputtering system or vacuum evaporation system, wherein the shield formation step includes an adhesion layer formation step of forming an adhesion layer by depositing a first adhesion film composed of a metal selected from the group consisting of Ti, Cr, Ni, TiCr, TiAl, NiAl, CrAl, and CrNiAl on the surface of the sealing resin layer, a conductive layer formation step of forming a conductive layer on a surface of the first adhesion film, and a protective layer formation step of forming a protective layer by depositing a protective film composed of a nitride, oxide, or oxynitride of a metal selected from the group consisting of Ti, Cr, Ni, TiCr, TiAl, NiAl, CrAl, and CrNiAl on a surface of the conductive layer; and in the protective layer formation step, the nitride, the oxide, or the oxynitride is formed by introducing a nitrogen gas and/or oxygen gas into a vacuum chamber of the sputtering system or the vacuum evaporation system.

According to this manufacturing method, a module including a shield layer having excellent adhesion strength and scratch resistance can be easily manufactured.

Furthermore, in the protective layer formation step, the protective film composed of a nitride, oxide, or oxynitride of the same metal as that of the first adhesion film deposited in the adhesion layer formation step may be deposited. In this case, since the same target or evaporation source can be used in the protective layer formation step and the adhesion layer formation step, a shield layer having excellent adhesion strength and scratch resistance can be formed inexpensively.

Furthermore, in the protective layer formation step, by setting the concentration of nitrogen or oxygen in the gas introduced into the vacuum chamber during forming the inner layer side of the protective film close to the conductive layer to be lower than that during forming the outer layer side of the protective film far from the conductive layer, the composition ratio of nitrogen or oxygen in the inner layer side of the protective film may be set to be lower than that in the outer layer side. In this case, a module having excellent scratch resistance and high adhesion strength with the conductive layer can be easily manufactured.

According to the present disclosure, the first adhesion film is formed of a metal selected from the group consisting of Ti, Cr, Ni, TiCr, TiAl, NiAl, CrAl, and CrNiAl. All of these metal films have higher adhesion strength with the sealing resin layer than Cu, Al, or Ag which is a metal generally used for forming a conductive layer. Furthermore, the protective film formed of a nitride, oxide, or oxynitride of any one of these metals has a higher hardness than a protective film composed of an alloy, such as SUS, or a single metal. Therefore, a module including a shield layer having excellent adhesion strength and impact resistant characteristics can be provided.

DETAILED DESCRIPTION OF THE DISCLOSURE

<First Embodiment>

A module 1 according to a first embodiment of the present disclosure will be described with reference to FIG. 1. Note that FIG. 1 is a cross-sectional view of the module 1.

Figures 1, 2:
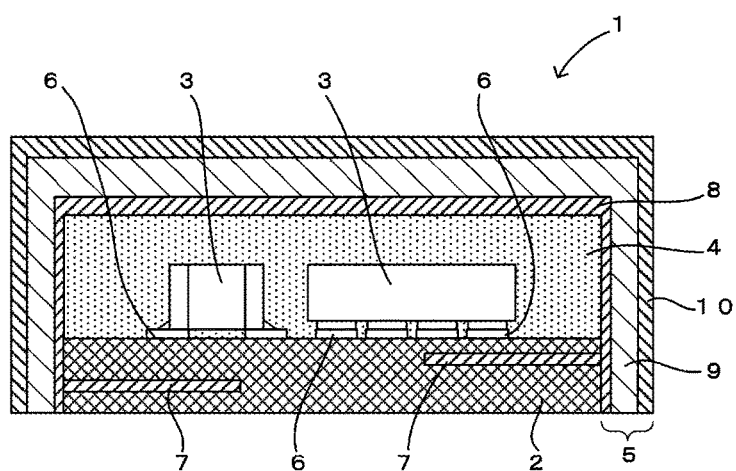
FIG. 1 is a cross-sectional view of a module according to a first embodiment of the present disclosure.
FIG. 2 is a table showing the hardness of the metal components and the nitrides thereof constituting the protective layer shown in FIG. 1.

The module 1 according to this embodiment includes, as shown in FIG. 1, a wiring board 2, a plurality of components 3 mounted on a principal surface of the wiring board 2, a sealing resin layer 4 which is provided on an upper surface of the wiring board 2 and covers the components 3, and a shield layer 5 provided so as to cover a surface of the sealing resin layer 4. For example, the module 1 is installed on a motherboard or the like of an electronic device in which high-frequency signals are used.

The wiring board 2 is, for example, composed of a low temperature co-fired ceramic, glass epoxy resin, or the like. A plurality of land electrodes 6 for mounting the components 3 are disposed on the upper surface of the wiring board 2 (corresponding to the "principal surface of the wiring board" in the present disclosure). Furthermore, a ground electrode 7 for earthing, various line electrodes (not shown), and a plurality of via conductors (not shown) are disposed in the wiring board 2. The ground electrode 7 is provided so as to be exposed from an end face (side face) of the wiring board 2.

The land electrodes 6, the ground electrode 7, and the line electrodes are each formed of a metal, such as Cu or Al, which is a metal generally used as line electrodes. Furthermore, the via conductors are formed of a metal, such as Ag or Cu. Note that the land electrodes 6 may be subjected to Ni/Au plating.

Examples of the components 3 include semiconductor devices made of semiconductors, such as Si and GaAs, and chip components, such as chip inductors, chip capacitors, and chip resistors.

The sealing resin layer 4 is provided so as to cover the upper surface of the wiring board 2 and the components 3. The sealing resin layer 4 can be formed of a resin, such as an epoxy resin, which is generally used as a sealing resin.

The shield layer 5 has a multilayer structure which includes an adhesion layer 8 stacked on the surface of the sealing resin layer 4, a conductive layer 9 stacked on the adhesion layer 8, and a protective layer 10 stacked on the conductive layer 9, thus achieving improvements in adhesion with the sealing resin layer 4 and scratch resistance. Furthermore, the shield layer 5 is electrically connected to the ground electrode 7 exposed from the side face of the wiring board 2.

The adhesion layer 8 is provided in order to enhance the adhesion strength between the conductive layer 9 and the sealing resin layer 4. In this embodiment, the adhesion layer 8 is formed of a first adhesion film composed of a metal selected from the group consisting of Ti, Cr, Ni, TiCr, TiAl, NiAl, CrAl, and CrNiAl. Furthermore, at the side face of the wiring board 2, the adhesion layer 8 is electrically connected to the ground electrode 7 exposed from the side face. Preferably, the thickness of the adhesion layer 8 is 0.01 to 0.5 μm at the thinnest portion of the side face or the like.

The conductive layer 9 is a layer that substantially assumes the shielding function of the shield layer 5, and is formed of a conductive film composed of a metal selected from the group consisting of Cu, Ag, and Al. Preferably, the thickness of the conductive layer 9 is 0.5 to 5 μm at the thinnest portion of the side face or the like.

The protective layer 10 is provided in order to prevent the conductive layer 9 from being corroded or scratched. In this embodiment, the protective layer 10 is formed of a protective film composed of a nitride, oxide, or oxynitride of a metal selected from the group consisting of Ti, Cr, Ni, TiCr, TiAl, NiAl, CrAl, and CrNiAl. Preferably, the thickness of the protective layer 10 is 0.03 to 1.5 μm at the thinnest portion of the side face or the like. When the thickness of the protective layer 10 is 0.03 μm or more, corrosion of the conductive layer 9 can be effectively suppressed. Furthermore, when the thickness of the protective layer 10 is 1.5 μm or less, an unnecessary increase in the thickness of the shield layer can be avoided.

(Method for Manufacturing Module)

Next, a method for manufacturing a module 1 will be described. In this embodiment, a method for manufacturing a module 1 in which a shield layer 5 is formed by using a sputtering system will be described as an example.

First, components 3 are mounted on an upper surface of a wiring board 2 composed of a low temperature co-fired ceramic (LTCC), glass epoxy resin, or the like. Note that electrodes, such as land electrodes 6, ground electrodes 7, and via conductors, are formed, by a known method, in or on the wiring board 2. The components 3 can be mounted by a common surface mount technology, such as solder mounting. After the components 3 are mounted, flux cleaning may be performed.

Next, the components 3 are sealed with an epoxy resin to form a sealing resin layer 4, thus preparing a mold structure which includes the wiring board 2, the components 3 mounted on the upper surface of the wiring board 2, and the sealing resin layer 4 stacked on the upper surface of the wiring board so as to cover the upper surface of the wiring board 2 and the components 3 (the preparation step). The sealing resin layer 4 can be formed by a coating method, printing method, transfer molding method, compression molding method, or the like.

In order to make the module height uniform, after the sealing resin layer 4 is formed, the top face of the sealing resin layer 4 may be subjected to grinding. Furthermore, in order to enhance the adhesion between the sealing resin layer 4 and the wiring board 2, dry cleaning, such as plasma etching, may be performed before forming the sealing resin layer 4. Furthermore, in the case where a release film is used when the components 3 are sealed with a resin, for example, in a transfer molding method, compression molding method, or the like, the release film whose resin contact surface has been roughened may be used. In this case, irregularities are formed on the surface of the sealing resin layer 4, and the surface of the shield layer 5 also becomes irregular. Accordingly, finger oil and the like are unlikely to adhere to the surface of the shield layer 5, and appearance deficiencies, such as small scratches and dirt, are unlikely to become noticeable. In this case, the surface roughness Ra of the sealing resin layer 4 is preferably 1 to 10 μm.

In the case where a module 1 is manufactured by using a multi-piece, collective board in which a plurality of wiring boards 2 are collectively formed, after the sealing resin layer 4 is formed, singulation into individual mold structures is performed by a dicer, laser, router, or the like. In this case, the collective board may be subjected to half cutting. In the case of half cutting, since the shield layer 5 can be deposited in the collective board state, high work efficiency can be achieved.

Next, the mold structures after singulation are arranged and supported on a tray for sputtering. In this case, in order to prevent a sputtered film from extending over the lower surface of the wiring board 2, a paste or tape may be applied to the lower surface of the wiring board 2.

Next, the tray on which the mold structures are set is placed at a predetermined position in a chamber of the sputtering system, and a vacuum is drawn in the chamber. From the viewpoint of the film quality, the target degree of vacuum is preferably as low as possible, which, however, prolongs the time required for vacuum drawing. From the viewpoint of productivity, the set target degree of vacuum is preferably $1\times10^{-3}$ to $1\times10^{-1}$ Pa. Furthermore, in order to reduce the time required for vacuum drawing, the chamber may be configured to include a sputtering chamber and a load-lock chamber (i.e., front chamber). As the sputtering system, an in-line system, batch system, single wafer system, or the like can be used.

Next, as necessary, the surface of the mold structure is subjected to dry etching before sputtering. In this case, by applying a voltage to an Ar ion gun for a required period of time, the surface of the sealing resin layer 4 and the side face of the wiring board 2 are dry cleaned with Ar ions. In such a manner, unwanted substances which can cause a decrease in the adhesion between the shield layer 5 and the sealing resin layer 4 can be removed, and also, an anchor effect is generated by roughening the surface of the mold structure, resulting in an improvement in the adhesion between the sealing resin layer 4 and the shield layer 5 (adhesion layer 8).

Next, an adhesion layer 8 (the first adhesion film) is deposited by sputtering on the surface of the sealing resin layer 4 and the side face of the wiring board 2 (the adhesion layer formation step). In this case, a metal selected from the group consisting of Ti, Cr, Ni, TiCr, TiAl, NiAl, CrAl, and CrNiAl can be used as a target material. For example, in the case where the adhesion layer 8 is formed of a first adhesion film composed of Ti, sputtering is performed by applying a voltage to a Ti target for a desired period of time. At this time, the film thickness is set to be 0.01 to 0.5 μm. Ar gas which serves as a plasma source is used as a gas to be introduced into the chamber. At this time, the introduction amount is, for example, set to be 30 to 300 sccm.

Note that in order to remove oxides on the surface of the target, pre-sputtering (i.e., sputtering with the shutter being closed) may be performed. Furthermore, regarding the target, in addition to a metal target, a sintered target and the like can be used. Depending on the composition of an alloy, it may be difficult to form a metal target. In the case of a sintered target, the metal composition ratio can be adjusted in any composition, and therefore, adhesion and corrosion resistance can be easily optimized.

Furthermore, regarding the power type of the sputtering system, DC type, pulsed type, RF type, or the like can be used. In the case of performing the pulsed type and the RF type, even when a reaction product (oxide, nitride, or oxynitride) is deposited on the surface of the target and the resistance value is increased, discharging can be stably performed.

Next, by the same procedure as that for the adhesion layer 8, a conductive film constituting a conductive layer 9 is deposited by sputtering on the surface of the adhesion layer 8 (the conductive layer formation step). In this case, a metal selected from the group consisting of Cu, Ag, and Al can be used as a target material. For example, in the case where the conductive layer 9 is formed of Cu, sputtering is performed by applying a voltage to a Cu target for a desired period of time. At this time, the film thickness is set to be 0.5 to 5 μm. Furthermore, as in the case of the adhesion layer 8, pre-sputtering may be performed on the Cu target.

Next, by the same procedure as that for the adhesion layer 8, a protective film constituting a protective layer 10 is deposited by sputtering on the surface of the conductive layer 9 (the protective layer formation step), thereby completing a module 1. In this case, a metal selected from the group consisting of Ti, Cr, Ni, TiCr, TiAl, NiAl, CrAl, and CrNiAl can be used as a target material. Furthermore, at this time, the thickness of the protective film is set to be 0.03 to 1.5 μm. When the protective layer 10 is formed, as a gas to be introduced into the chamber, in addition to Ar gas which serves as a plasma source, a gas which reacts with the target metal to form a reaction product is simultaneously introduced. For example, in the case where an oxide is desired as the reaction product, oxygen gas is introduced simultaneously with Ar gas, and in the case where a nitride is desired as the reaction product, nitrogen gas is introduced simultaneously with Ar gas. In the case where an oxynitride is desired as the reaction product, oxygen gas and nitrogen gas are introduced simultaneously with Ar gas. In such a manner, a protective layer 10 (the protective film) composed of an oxide, nitride, or oxynitride of any one of the metals described above can be formed.

In such a film deposition method, by controlling the introduction amount (flow rate) of oxygen gas or nitrogen gas, the composition ratio of the reaction product can be controlled. For example, in the case where the protective layer 10 (the protective film) is formed of a nitride of Ti (TiN), by using a Ti target and introducing, for example, 2% to 20% (volume % in the chamber) of N2 gas relative to Ar gas with a flow rate of 200 sccm, a protective layer 10 (the protective film) is deposited. The adhesion layer formation step, the conductive layer formation step, and the protective layer formation described above correspond to the "shield formation step" according to the present disclosure.

Regarding the thickness of each of the adhesion layer 8, the conductive layer 9, and the protective layer 10 which constitute the shield layer 5, the thickness of the layer on the top face side of the sealing resin layer 4 may be larger than the thickness of the layer on the side face side of the sealing resin layer 4. The layer on the top face side has a large surface area and has a high possibility of being influenced by noise, and therefore, it is necessary to increase the thickness. In contrast, the layer on the side face side has a small surface area and has a limited possibility of being influenced by noise, and therefore, the thickness may be smaller than that of the layer on the top face side. Accordingly, by not increasing the thickness of the layer on the side face side more than necessary, material costs can be controlled, and also the size (area when viewed in plan in the thickness direction of the wiring board 2) of the module 1 can be reduced.

All of Ti, Cr, Ni, TiCr, TiAl, NiAl, CrAl, and CrNiAl which are metals used for the adhesion layer 8 have a higher resistivity than metals (Cu, Ag, and Al) used for the conductive layer 9. Therefore, as the thickness of the adhesion layer 8 increases, the connection resistance between the conductive layer 9 and the ground electrode 7 increases, and with this increase, the shielding characteristics of the shield layer 5 are degraded. Furthermore, the conductive layer 9 is a layer that substantially assumes the shielding function, and as the thickness thereof increases, the shielding characteristics of the shield layer 5 will be improved. In consideration of these situations, regarding the thickness of each of the adhesion layer 8, the conductive layer 9, and the protective layer 10 in the shield layer 5, preferably, the conductive layer 9 has the largest thickness, and the adhesion layer 8 has the smallest thickness.

Furthermore, when reduction in formation costs for the shield layer 5 is attempted, it is preferred that the metal component of the protective layer 10 is the same as the metal constituting the adhesion layer 8. In this case, the same target can be used during forming the adhesion layer 8 and the protective layer 10, and the shield layer 5 can be formed by preparing two types of target. Furthermore, for example, in the case where the sputtering system enables the targets to be arranged at three positions, the targets for forming the conductive layer 9 which needs to have the largest thickness can be arranged at two positions, and therefore, the time required for forming the shield layer 5 can be reduced.

In this embodiment, the case where the shield layer 5 is formed by using the sputtering system has been described. However, the shield layer 5 may be formed, for example, by using a vacuum evaporation system. In this case, when the protective layer 10 is formed, as in sputtering, with a reactant gas (nitrogen gas, oxygen gas, or the like) being introduced into a chamber, an evaporation source may be evaporated.

According to the embodiment described above, the adhesion layer 8 (the first adhesion film) is formed of a metal selected from the group consisting of Ti, Cr, Ni, TiCr, TiAl, NiAl, CrAl, and CrNiAl. All of these metal films have higher adhesion strength with the sealing resin layer 4 than Cu, Al, or Ag which is a metal generally used for forming a conductive layer 9.

Furthermore, the protective layer 10 (the protective film) formed of a nitride, oxide, or oxynitride of any one of these metals has a higher hardness than a protective film composed of an alloy or single metal. For example, as shown in FIG. 2, regarding each of Ti, Cr, and a TiAl alloy, the nitride has a higher Vickers hardness than the pure metal, the Vickers hardness indicating the scratch resistance of the protective layer 10 (the protective film). Similarly, the oxide has a higher hardness than the pure metal. Therefore, by forming the shield layer 5 with the structure described above, a module 1 including a shield layer 5 having excellent adhesion strength and scratch resistance can be provided.

Among Ti, Cr, Ni, TiCr, TiAl, NiAl, CrAl, and CrNiAl, Cr, Ti and Ni have excellent adhesion with the sealing resin layer 4. Furthermore, nitrides of Ti, TiAl, Cr, and Ni (TiN, TiAlN, CrN, and NiN) and oxides of Ti, Cr, and Ni have a high hardness and excellent scratch resistance. Furthermore, nitrides of Ti, Cr, Ni, and TiCr (TiN, CrN, NiN, and TiCrN) and oxides of Ti, Cr, and Ni have excellent corrosion resistance. Accordingly, the metal components constituting the adhesion layer 8 and the protective layer 10 may be appropriately changed depending on the desired characteristics.

Furthermore, regarding the protective layer 10 (the protective film), when the protective film is formed of TiN, the protective film is gold in color, and when formed of CrN, the protective film is silver white in color. Thus, a shield layer 5 having excellent heat reflectivity can be formed. In particular, when there is a heat source near the module 1, since heat is reflected, the temperature of the module 1 can be maintained low. Furthermore, in this case, there is an advantage in that fingermarks, such as finger oil, are unlikely to be noticeable. Furthermore, when printing is performed on the surface of the protective layer 10 (the protective film), black ink can be used. Furthermore, when the protective layer 10 (the protective film) is formed of TiAlN, the protective film is black in color. In the case where a module product generates heat, because of high heat dissipation, the temperature of the module product can be maintained low. In this case, when printing is performed on the surface, white ink can be used.

<Second Embodiment>

Figure 3:
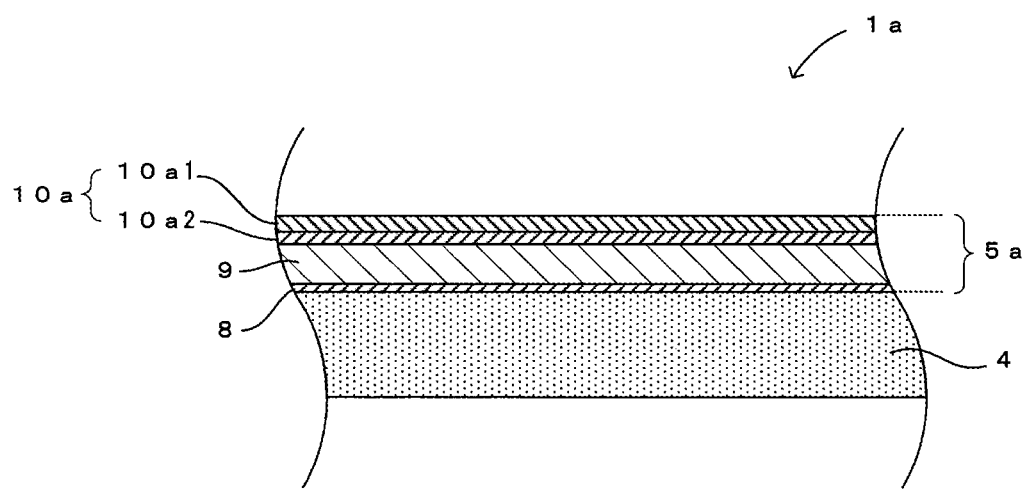
FIG. 3 is a view for explaining a shield layer of a module according to a second embodiment of the present disclosure.

A module 1a according to a second embodiment of the present disclosure will be described with reference to FIG. 3. FIG. 3 is a partial cross-sectional view of the module 1a for explaining a shield layer 5a of the module 1a.

The module 1a according to this embodiment differs from the module 1 according to the first embodiment described with reference to FIG. 1 in that, as shown in FIG. 3, a protective layer 10a has a different structure. The other structure is the same as that of the module 1 according to the first embodiment, and the description will be omitted by denoting the same components as those of the first embodiment with the same reference signs.

In this case, the protective layer 10a includes a protective film 10a1 and a second adhesion film 10a2. The protective film 10a1 is composed of a nitride, oxide, or oxynitride of a metal selected from the group consisting of Ti, Cr, Ni, TiCr, TiAl, NiAl, CrAl, and CrNiAl, as in the protective layer 10 (the protective film) according to the first embodiment. The second adhesion film 10a2 is provided in order to enhance the adhesion between the protective film 10a1 and the conductive layer 9 (conductive film). In this embodiment, the second adhesion film 10a2 is composed of a metal selected from the group consisting of Ti, Cr, Ni, TiCr, TiAl, NiAl, CrAl, and CrNiAl, as in the adhesion layer 8 (the first adhesion film) according to the first embodiment. Preferably, the thickness of the second adhesion film 10a2 is 0.01 to 0.5 μm.

Regarding a method for manufacturing a module 1a, the module 1a is manufactured by the same procedure as that for the module 1 according to the first embodiment until before a protective layer 10a is formed. Regarding a method of forming the protective layer 10a, first, a second adhesion film 10a2 is deposited by sputtering on the surface of the conductive layer 9 by the same procedure as that for the adhesion layer 8 (the first adhesion film) according to the first embodiment. The protective film 10a1 is formed, as in the protective layer 10 (the protective film) according to the first embodiment, for example, by sputtering by applying a voltage to a Ti target for a desired period of time in the case where the protective film 10a1 is formed of a nitride, oxide, or oxynitride of Ti. As a gas to be introduced into a chamber of the sputtering system, in addition to Ar gas which serves as a plasma source, a gas which forms a reaction product with a metal (Ti) is simultaneously introduced. For example, in the case where an oxide is desired as the reaction product, oxygen gas is introduced simultaneously with Ar gas, and in the case where a nitride is desired as the reaction product, nitrogen gas is introduced simultaneously with Ar gas. In the case where an oxynitride is desired as the reaction product, oxygen gas and nitrogen gas are introduced simultaneously with Ar gas.

Furthermore, as in the protective layer 10 according to the first embodiment, by controlling the introduction amount (flow rate) of oxygen gas or nitrogen gas, the composition ratio of the reaction product can be controlled. In the case where the protective layer 10 (the protective film) is formed of a nitride of Ti (TiN), for example, by introducing 2% to 20% (volume % in the chamber) of N2 gas relative to Ar gas with a flow rate of 200 sccm, a protective layer 10 (the protective film) is deposited. In this embodiment, it is also possible to use a vacuum evaporation system, in addition to the sputtering system, to deposit the shield layer 5a.

According to this structure, the adhesion between the sealing resin layer 4 and the shield layer 5a can be enhanced, and the adhesion between the conductive layer 9 and the protective layer 10a can also be enhanced.

The metal components of the adhesion layer 8 (the first adhesion film), and the protective film 10a1 and the second adhesion film 10a2 of the protective layer 10a may be composed of the same metal. In this case, the adhesion layer 8 and the protective layer 10a can be deposited by preparing one type of target or evaporation source, and therefore, the formation costs for the shield layer 5a can be reduced. Furthermore, for example, in the case where the sputtering system enables targets to be arranged at three positions, targets for forming the conductive layer 9 which needs to have the largest thickness can be arranged at two positions, and therefore, the time required for forming the shield layer 5a can be reduced.

<Third Embodiment>

Figure 4:
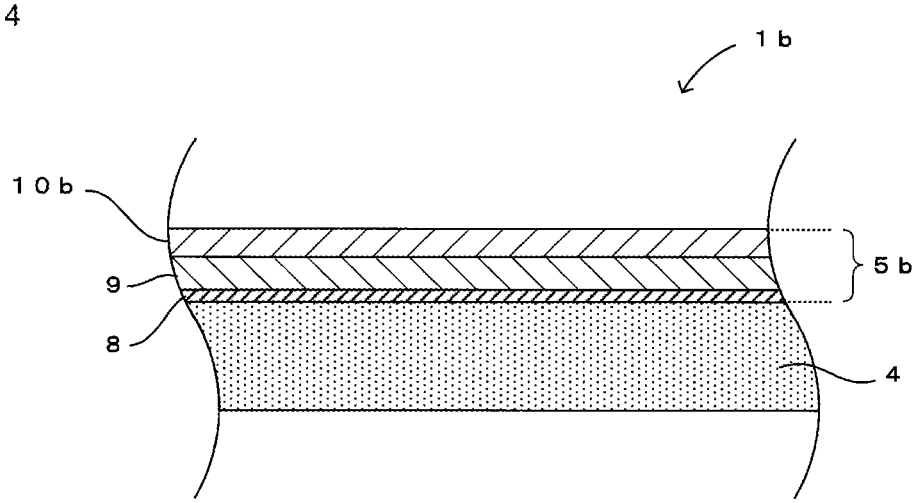
FIG. 4 is a view for explaining a shield layer of a module according to a third embodiment of the present disclosure.
Figure 5:
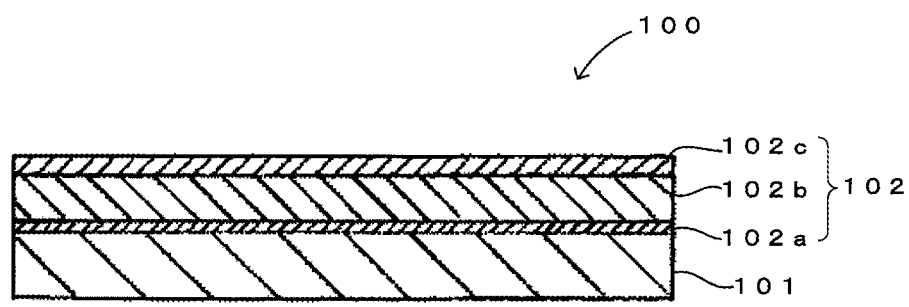
FIG. 5 is a cross-sectional view of an existing module.

A module 1b according to a third embodiment of the present disclosure will be described with reference to FIG. 4. FIG. 4 is a partial cross-sectional view of the module 1b for explaining a shield layer 5b of the module 1b.

The module 1b according to this embodiment differs from the module 1 according to the first embodiment described with reference to FIG. 1 in that, as shown in FIG. 4, a protective layer 10b has a different structure. The other structure is the same as that of the module 1 according to the first embodiment, and the description will be omitted by denoting the same components as those of the first embodiment with the same reference signs.

In this case, the protective layer 10b is formed such that the composition ratio of the nitride or the composition ratio of the oxide constituting the protective layer 10b (the protective film) in the inner layer side of the protective layer 10b close to the conductive layer 9 is lower than that in the outer layer side of the protective layer 10b far from the conductive layer 9. Specifically, protective layer 10b is formed such that the composition ratio of nitrogen or oxygen in the nitride or oxide gradually increases from the inner layer side toward the outer layer side. That is, the protective layer 10b is formed such that the composition ratio linearly changes.

Regarding a method for manufacturing a module 1b, the module 1b is manufactured by the same procedure as that for the module 1 according to the first embodiment until before a protective layer 10b is formed. Although the formation method for the protective layer 10b (the protective film) is substantially the same as that for the protective layer 10 according to the first embodiment, by gradually increasing the concentration of the reactant gas (nitrogen gas or oxygen gas) in the gas introduced into the chamber during deposition of the protective layer 10b, the protective layer 10b (the protective film) in which the composition ratio of nitrogen or oxygen linearly increases toward the outer layer side is formed. Note that the concentration of the reactant gas in the introduced gas may be stepwise increased toward the outer layer side.

In such a manner, by gradually changing the composition ratio of oxygen or nitrogen in the protective layer 10b, the coefficient of thermal expansion in the protective layer 10b gradually changes from the inner layer side toward the outer layer side. Accordingly, the protective layer 10b can be made to function as a buffer film against stress applied during heating, such as reflowing. Furthermore, since the composition ratio of the metal component having high adhesion with the conductive layer 9 is high in the inner layer side of the protective layer 10b (the protective film), an improvement in the adhesion between the conductive layer 9 and the protective layer 10b can be achieved. Furthermore, since the composition ratio of oxygen or nitrogen is high in the upper layer side of the protective layer 10b, the hardness of the surface of the protective layer 10b is maintained. Therefore, improvements in scratch resistance of the protective layer 10b and adhesion with the conductive layer 9 can be achieved.

The present disclosure is not limited to the embodiments described above, and various modifications are possible without departing from the spirit of the disclosure.

The present disclosure can be applied to various modules including a sealing resin layer which covers components mounted on a wiring board and a shield layer which is stacked on the sealing resin layer.

1, 1a, 1b module
2 wiring board
3 component
4 sealing resin layer
5, 5a, 5b shield layer
8 adhesion layer (the first adhesion film)
9 conductive layer
10, 10a, 10b protective layer
10a1 protective film
10a2 second adhesion film

The invention claimed is:

1. A module comprising: a wiring board; a component mounted on a principal surface of the wiring board; a sealing resin layer provided on the principal surface of the wiring board and covering the component; and a shield layer provided so as to cover a surface of the sealing resin layer, wherein the shield layer includes: an adhesion layer stacked over the surface of the sealing resin layer and including a first adhesion film composed of a metal selected from a group consisting of Ti, Cr, Ni, TiCr, TiAl, NiAl, CrAl, and CrNiAl; a conductive layer stacked over the adhesion layer; and a protective layer stacked over the conductive layer and including a protective film composed of a nitride, an oxide or an oxynitride of a metal selected from the group consisting of Ti, Cr, Ni, TiCr, TiAl, NiAl, CrAl, and CrNiAl; wherein the protective film is composed of a nitride, an oxide or an oxynitride of a same metal as the metal of the first adhesion film.

2. The module according to claim 1, wherein the protective layer further includes a second adhesion film composed of a metal selected from the group consisting of Ti, Cr, Ni, TiCr, TiAl, NiAl, CrAl, and CrNiAl, the second adhesion film being disposed between the conductive layer and the protective film.

3. The module according to claim 1, wherein a composition ratio of nitrogen in the nitride or a composition ratio of oxygen in the oxide constituting the protective film is lower in an inner layer side of the protective film close to the conductive layer than in an outer layer side of the protective film far from the conductive layer.

4. The module according to claim 1, wherein among the adhesion layer, the conductive layer, and the protective layer, the conductive layer has the largest thickness, and the adhesion layer has the smallest thickness.

5. The module according to claim 1, wherein the first adhesion film is composed of a TiAl alloy, the conductive layer is composed of Cu, and the protective film is composed of a nitride of a TiAl alloy.

6. The module according to claim 1, wherein the first adhesion film is composed of a TiAl alloy, the conductive layer is composed of Cu, and the protective film is composed of an oxynitride of a TiAl alloy.

7. The module according to claim 2, wherein the second adhesion film is composed of a TiAl alloy.

8. The module according to claim 1, wherein the protective film is black in color.

9. The module according to claim 2, wherein a composition ratio of nitrogen in the nitride or a composition ratio of oxygen in the oxide constituting the protective film is lower in an inner layer side of the protective film close to the conductive layer than in an outer layer side of the protective film far from the conductive layer.

10. The module according to claim 2, wherein among the adhesion layer, the conductive layer, and the protective layer, the conductive layer has the largest thickness, and the adhesion layer has the smallest thickness.

11. The module according to claim 3, wherein among the adhesion layer, the conductive layer, and the protective layer, the conductive layer has the largest thickness, and the adhesion layer has the smallest thickness.

12. The module according to claim 3, wherein the first adhesion film is composed of a TiAl alloy, the conductive layer is composed of Cu, and the protective film is composed of a nitride of a TiAl alloy.

13. The module according to claim 4, wherein the first adhesion film is composed of a TiAl alloy, the conductive layer is composed of Cu, and the protective film is composed of a nitride of a TiAl alloy.

* * * * *